(12) United States Patent
Stahl et al.

(10) Patent No.: US 8,492,188 B2
(45) Date of Patent: Jul. 23, 2013

(54) METHOD FOR PRODUCING A MICROMECHANICAL COMPONENT

(75) Inventors: Heiko Stahl, Reutlingen (DE); Christina Leinenbach, Ensdorf (DE); Axel Franke, Ditzingen (DE); Jochen Reinmuth, Reutlingen (DE); Ando Feyh, Palo Alto, CA (US); Christian Rettig, Eningen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 13/296,923

(22) Filed: Nov. 15, 2011

(65) Prior Publication Data
US 2012/0129291 A1    May 24, 2012

(30) Foreign Application Priority Data

Nov. 23, 2010  (DE) .......................... 10 2010 061 782

(51) Int. Cl.
*H01L 21/00* (2006.01)
(52) U.S. Cl.
USPC ............. 438/50; 438/689; 438/694; 438/700; 438/702

(58) Field of Classification Search
USPC ............................. 438/50, 689, 694, 700, 702
See application file for complete search history.

(56) References Cited

U.S. PATENT DOCUMENTS

2001/0044165 A1 * 11/2001 Lee et al. .......................... 438/52
2005/0067633 A1 *  3/2005 Mushika ........................ 257/202

* cited by examiner

*Primary Examiner* — Jarrett Stark
*Assistant Examiner* — John M Parker
(74) *Attorney, Agent, or Firm* — Kenyon & Kenyon LLP

(57) ABSTRACT

A method for producing a micromechanical component is described. The method includes providing a substrate having a layer system including an insulating material situated on the substrate, a conductive layer section and a protective layer structure connected to the conductive layer section, which borders a section of the insulating material. The method furthermore includes carrying out an isotropic etching process for removing a part of the insulating material, the conductive layer section and the protective layer structure preventing the removal of the bordered section of the insulating material; and a structural element being developed, which includes the conductive layer section, the protective layer structure and the bordered section of the insulating material.

9 Claims, 9 Drawing Sheets

METHOD FOR PRODUCING A MICROMECHANICAL COMPONENT

CROSS REFERENCE

The present application claims the benefit under 35 U.S.C. §119 of German Patent Application No. DE 102010061782.2 filed on Nov. 23, 2010, which is expressly incorporated herein by reference in its entirety.

FIELD OF THE INVENTION

The present invention relates to a method for producing a micromechanical component, a substrate having a layer system situated on the substrate being provided and an etching process to form a structural element being carried out.

BACKGROUND INFORMATION

Micromechanical components which are used in the automotive field, as inertial or acceleration sensors, for example, normally have a micropattern having movable functional elements. The micropattern is also designated as a MEMS structure (microelectromechanical system). During the operation of the sensors, the deflection of a functional element is detected, for instance, by a change in the electrical capacitance compared to a fixed reference electrode.

Different methods may be performed to produce micromechanical component. One possible procedure is to develop functional or MEMS patterns based on CMOS production techniques (complementary metal oxide semiconductor). Conventionally, for instance, in CMOS process technology, one may use produced metallic circuit traces as free-standing, movable functional elements and as evaluation electrodes. For the (partial) exposure of circuit traces, an oxide that is lying under the circuit traces and is used as a sacrificial layer is removed. A disadvantage is, however, that (exposed) metal circuit traces have relatively poor mechanical properties. Also, conventional CMOS processes have proven unsuitable for producing structures having a high aspect ratio.

There are therefore alternative approaches in which the circuit traces remain connected via oxide layers to an associated silicon substrate. Furthermore, the substrate is patterned in such a way that silicon crosspieces are produced below the circuit traces. In such a micropattern the mechanical properties are essentially determined by the silicon crosspieces, which surpass the properties of pure exposed metal circuit traces. Then, too, silicon structures having a high aspect ratio are able to be produced.

The thickness and the height of a circuit trace pattern (typically 5 to 10 μm) produced according to CMOS process technology and used as an electrode is (generally) smaller than the electrode height in components having functional structures made of pure silicon (for instance, 10 to 100 μm). In such a process it is therefore important to enable the production of small patterns at low distances. One challenge is particularly the forming of narrow, deep trenches in an oxide.

Anisotropic plasma etching processes that are usable for oxide etching, however, have a tendency to produce positively converging etching sides. The circuit traces which are possibly used as etching masks may also be exposed to metal removal. Anisotropic plasma etching processes therefore limit the minimally attainable distance between metal circuit traces and the maximum attainable etching depth. By contrast, isotropic oxide etching methods result in a lateral slight etching in the area of etching accesses between individual circuit traces. Therefore, in the case of functional structures, which are constructed from a plurality of circuit traces, situated one over the other and connected via oxide layers in an insulating manner, complete underetching of the circuit traces may occur. This can be avoided by laying out the circuit traces to have a large width. Since the etching rate between the individual oxides can be very different, depending on the production, but this approach is connected with relatively wide electrode structures.

SUMMARY

An object of the present invention is to provide an improved method for producing a micromechanical component.

An example method for producing a micromechanical component is provided according to the present invention. The example method includes providing a substrate having a layer system situated on the substrate. The layer system includes an insulating material, a conductive layer section, and a protective layer structure connected to the conductive layer section, which borders one section of the insulating material. The method furthermore includes carrying out an isotropic etching process for removing a part of the insulating material. In this connection, the conductive layer section and the protective layer structure prevent the removal of the bordered section of the insulating material. By the etching, a structural element is also developed which includes the conductive layer section, the protective layer structure and the bordered section of the insulating material.

In the example method according to the present invention, an isotropic etching process is carried out, the protective layer structure (together with the conductive layer section) being used as an "etch stop layer". Such a method allows for the possibility of developing the structural element, which is able to be used in the component as an electrode structure, to have a small width. A plurality of electrode structures at small distances apart may also be produced. Carrying out the isotropic etching method may be connected with a relatively small removal of the conductive layer section. It is thereby possible to etch through a relatively large thickness of the insulating material and to produce the structural element to have a great height. A high reproducibility may also be achieved. Because of the use of the protective layer structure, the isotropic etching process is relatively uncritical with respect to etching parameters such as the etching time and the etching uniformity. Connected to this is a clear simplification in the processing, whereby a further cost saving comes about. Over and above that, one may circumvent problems arising in conventional plasma etching processes, at high power and high etching rate, of electrical arc-over ("arcing") having the result of the destruction of a component.

In one preferred specific embodiment, the layer system situated on the provided substrate includes a plurality of conductive layer sections situated in different planes and connected by protective layer structures. The protective layer structure respectively border one section of the insulating material. Because of the carrying out of the isotropic etching process for removing a part of the insulating material, a structural element is formed which includes layer sections, protective layer structures and bordered sections of the insulating material situated in a plurality of planes. In this embodiment, the protective layer structure and the conductive layer sections are able to be used in a corresponding manner as etch stop layers, in order to enable producing, in a simple and reproducible manner, a structural element having a plurality of conductive layer sections situated one over another.

In a further preferred specific embodiment, after the carrying out of the isotropic etching process for removing a part of the insulating material, an etching process is carried out for removing the protective layer structure or protective layer structures. By doing this, it may be achieved in a simple manner that conductive layer sections, situated in a plurality of planes, are only still connected via (previously bordered) sections of the insulating material, and therefore in an insulating manner to one another.

In one further preferred specific embodiment, the method furthermore includes removing substrate material of the substrate so as to expose the structural element. By doing this, it may be achieved that the structural element is situated movably on the substrate, whereby, for instance, an acceleration acting on the substrate is able to be detected. The removing of substrate material may be carried out, for instance, in the form of trenching, in order to develop a crosspiece for the structural element that includes substrate material. The removal of the substrate material and the abovementioned removal of the protective layer structure(s) may also be carried out in a common process, whereby the method is further able to be simplified.

The method may also be used in an advantageous manner for producing narrow differential electrode structures. In this respect, according to a further preferred specific embodiment, a structural element is developed which, in different planes, has respectively two conductive layer sections. In a corresponding manner, protective layer structures and conductive layer sections may be used as etch stop layers, in order to prevent the removal of sections of the insulating material.

In a further preferred specific embodiment, in the layer system situated on the provided substrate, a protective layer structure connected to the conductive layer section is (also) connected to the substrate. It may be achieved thereby that the structural element, developed within the scope of the isotropic etching method, is situated directly on the substrate.

In one further preferred specific embodiment, the layer system situated on the provided substrate also has an intervening layer which is connected via a protective layer structure to a conductive layer section, and by which a section of the insulating material, that is connected to the substrate, is separated from a further section of the insulating material. During the carrying out of the isotropic etching process for removing a part of the insulating material, the additional section of the insulating material is removed, whereas the section of the insulating material that is connected to the substrate is protected from being removed. Such a procedure offers the possibility of avoiding an (undesired) removing of substrate material during a subsequently performed removal of protective layer structures.

The intervening layer is preferably removed within the scope of removing the protective layer structure(s), and a further etching process is carried out to remove, or rather, open a part of the section of the insulating material that is connected to the substrate. Following this, for example, a trench etching process may be carried out to remove substrate material, a narrow crosspiece including substrate material may be produced for the structural element.

In one further preferred specific embodiment, the insulating material is an oxide material. The oxide material may particularly be constructed of a plurality of oxide layers applied one after another. In this respect, the provided substrate may particularly be a CMOS wafer, and the layer section situated on the substrate may be developed in the form of a "backend" stack.

In one further preferred specific embodiment, the protective layer structure(s) has/have tungsten or copper. Such materials are materials usually used in a CMOS process, and therefore make possible a cost-effective carrying out of the method.

Below, the present invention is explained in greater detail with reference to the figures.

DETAILED DESCRIPTION OF EXAMPLE EMBODIMENTS

Figure 1:
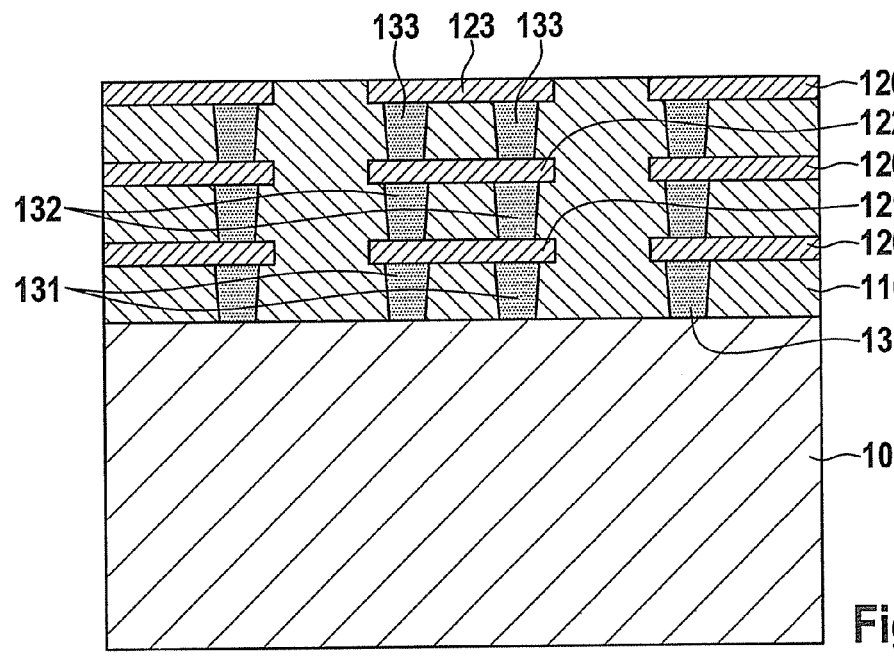
FIGS. 1 to 5 show the production of a micromechanical functional structure, in each case in a lateral schematic sectional representation.

Based on the figures, example methods for producing micromechanical elements or MEMS components are described, which may be based on CMOS production technology. In the components represented in exemplary fashion, what is involved is capacitive inertial sensors and acceleration sensors, which have a comb structure that is partially detached from a substrate and is thus movable, having associated finger-like structural elements and a comb structure that is fixedly anchored to the substrate that has additional finger-like structural elements. The structural elements of both comb structures are situated next to one another and engaging into one another. In the operation of such sensors, structural elements of the movable comb structure are able to be deflected as a result of an acceleration with respect to structural elements of the fixed comb structure. The deflection, which depends on the respectively acting acceleration, is detected based on a capacitance change between the comb structures, or rather, between the structural elements ("comb electrodes") of the comb structures acting as electrodes.

The production of such microstructures is illustrated in the figures in the manner of cutouts, in the form of schematic lateral sectional representations. These show the development of only three structural elements 180, 181, 182 (FIGS. 1 to 5, FIGS. 7 to 14), situated side by side, and of only three structural elements 180, 183, 182 (FIGS. 15 to 18), situated side by side. In this connection, the two structural elements 180, 182 each lying at the outside in the figures, may be components of a firmly anchored, or immovable comb structure, and structural elements 181 and 183, that are each situated centrally, are able to be components of a freely movable comb structure. The respective structure made up of structural elements 180, 181, 182 and 180, 183, 182 may repeat many times as seen in the lateral direction, in this context.

Within the scope of the example production method, method processes available in semiconductor and microsystems technology, particularly CMOS processes and MEMS processes, may be carried out, and usual materials may be used, so that we shall discuss these only partially. Moreover, the components described may include structures in addition to the ones shown. Likewise in the production, besides the processes shown and described, additional method steps may be carried out to complete the production of the components shown.

FIGS. 1 to 5 show the production of a component having a micromechanical functional structure, in each case in a schematic lateral sectional representation. The method steps carried out in the method are also summarized in the flow chart of FIG. 6, to which are also referenced below. In the method, in a step 191, a substrate 100 is provided having a layer system situated on substrate 100 (see FIG. 1). Substrate 100 may particularly be a usual silicon substrate or a silicon wafer, and the layer system situated on substrate 100 may be a "backend" stack produced with the aid of CMOS process technology.

The layer system includes layer sections 120, situated in three different planes, of a metallic material and protective layer structures 130, which are (partially) embedded in an oxide material 110. Only the topsides of upper metallic layer sections 120 may be exposed, as shown in FIG. 1. Protective layer structures 130 are each situated between metallic layer sections 120 or rather, the (lower) metallic layer sections 120 and substrate 100, and are therefore connected to metallic layer sections 120 or rather, to metallic layer sections 120 and substrate 100.

Metallic layer sections 120 may have aluminum in them, for example, and protective layer structures 130 may have tungsten in them. In case of the use of such a material, protective layer structures 130 may also be designated as "tungsten plugs". An oxide material 110 may particularly be a silicon oxide. Counter to the representation in FIG. 1 (and the additional figures), oxide material 110 is constructed of a plurality of oxide layers applied one after the other.

The structure of the middle layer stack of the layer system of FIG. 1, from which structural element 181 derives (see FIG. 2), is described in greater detail below. The middle layer stack includes three metallic layer sections 120, situated one on top of the other and in different planes, which are labeled by reference numerals 121, 122, 123, for better illustration. In the same way, associated protective layer structures 130 that are situated one on top of the other are labeled by reference numerals 131, 132, 133. The metallic layer sections 121, 122, 123 (at least in the area of the sectional view shown in FIG. 1) are each, in a top view, developed in the form of elongated or finger-like circuit trace structures, and will also be designated below as "metal circuit traces" 121, 122, 123.

The two protective layer structures 132, 133 situated between the three metal circuit traces 121, 122, 123, and the lower protective layer structure 131 situated between lower metal circuit trace 121 and substrate 100 in each case have an enclosing form, so that protective layer structures 131, 132, 133 (together with metal circuit traces 121, 122, 123 and substrate 100) each border one section of oxide material 110. This is illustrated in the sectional representation of FIG. 1 with the aid of the two trapezoidal or stopper-shaped partial pieces per protective layer structure 131, 132, 133, between which, in each case, a section of oxide material 110 is situated. Protective layer structures 131, 132, 133 that are situated between metal circuit traces 121, 122, 123 and substrate 100, may furthermore, as indicated in FIG. 1, be provided in the vicinity of the edge sides or outer edges of metal circuit traces 121, 122, 123, and in this context, with respect to the outer edges, be displaced inwards a little or moved back.

Figure 2:
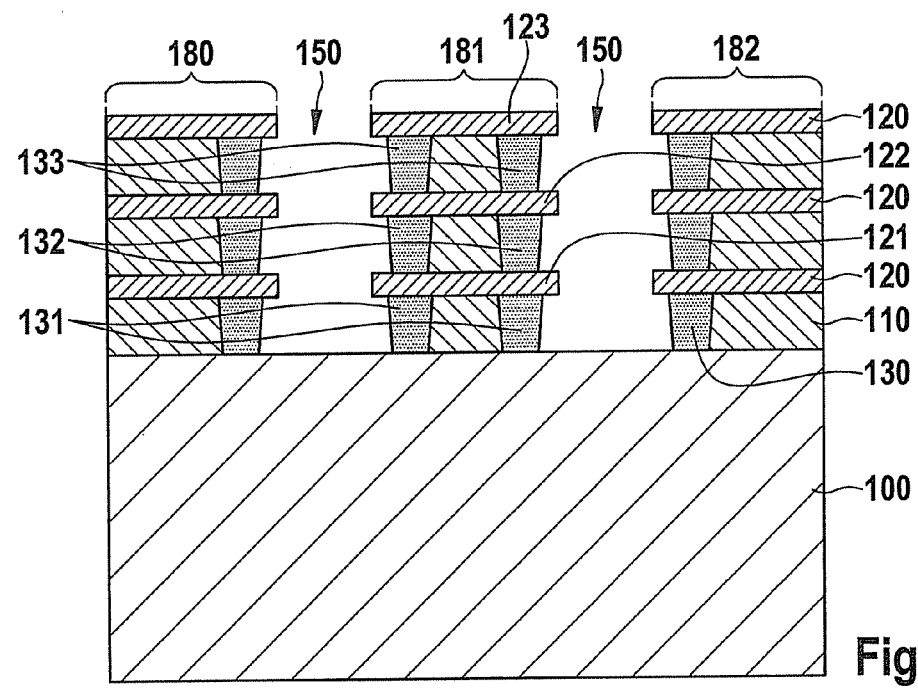

A comparable embodiment is also present in the case of the layer stacks that are situated laterally from them, from which structural elements 180, 182 come about (see FIG. 2). These layer stacks, of which only a partial region is shown, therefore have, in a corresponding manner, three finger-like metal circuit traces 120, that are situated one on top of the other in different planes, and between the metal circuit traces 120 or between lower metal circuit traces 120 and substrate 100 have enclosing protective layer structures 130 (in FIG. 1 indicated only with the aid of a single trapezoidal or stopper-shaped partial piece per protective layer structures 130), protective layer structures 130 (together with metal circuit traces 120 and substrate 100) each bordering a section of oxide material 110. In this case, too, protective layer structures 130 may be provided in the vicinity of the outer edges of metal circuit traces 120, and moved back a little with respect to the outer edges.

Carrying out step 191 for providing substrate 100, shown in FIG. 1, with a layer system situated on it may take place with the aid of CMOS processes, as was described above. One possible process sequence includes applying a layer of oxide material 110 onto substrate 100 and patterning same so as to develop recesses or trench structures for protective layer structures 130, filling up the recesses with appropriate protective layer material so as to form protective layer structures 130, applying a metallic layer 120 and patterning same to form metal circuit traces 120, as well as a single (more or double) repetition of these processes. Because of the above-mentioned embodiment, moved inwards, of protective layer structures 130 with respect to the outer edges of metal circuit traces 120, one is able to avoid damage to protective layer structures 130 during the patterning of respective metal layer 120.

Subsequently to providing the "CMOS wafers" shown in FIG. 1, in a further step 192 (FIG. 6), an isotropic etching process is carried out, so as to remove a freely accessible or exposed part of oxide material 110 that is used as sacrificial layer or sacrificial material. Because of this, as shown in FIG. 2, narrow trenches 150 ("oxide trenches") that expose a part of the topside of substrate 100 are produced, and as a result, structural elements 180, 181, 182 are formed on substrate 100 that are defined separated from one another. Trenches 150 shown may, in this case, be part of a common and connected trench structure. In the oxide etching, protective layer structures 130 together with metal circuit traces 120 are used as etch stop layers, whereby the removing of the sections of oxide material 110 respectively bordered by these structures is prevented. In other words, because of protective layer structures 130, a lateral underetching of metal circuit traces 120 is able to be avoided or underetching under metal circuit traces 120 is able to be locally restricted.

Isotropic oxide etching methods that come into consideration, in which there exists a high etching selectiveness with respect to oxide material 110, and therefore an etching attack on metal circuit traces 120 are able to be avoided or ignored, are, for instance, gas phase etching using HF or plasma etching, particularly using $C_3F_8+O_2$, or one of the following gases: $CHF_3$, $C_4F_8$, $C_xF_yH_z$, $NF_3$. The use of a wet chemical etching solution is also conceivable. This includes, for instance, a so-called BOE process (buffered oxide etch) based on HF. In such a process, a dilution of the etch-active substance may be selected in such a way that the selectivity between oxide and metal is appropriately high, and as a result an etching attack on metal circuit traces 120 is negligible.

Structural elements 180, 181, 182 produced by oxide etching and situated on substrate 100 each include three metal circuit traces 120 situated one on top of another, protective layer structures 130 and bordered sections of oxide material 110. Structural elements 180, 181, 182 have (at least in the area of the sectional view shown in FIG. 2) in each case elongated or finger-like contours in a top view. As was indicated above, structural elements 180, 182 (as well as additional comparable structural elements not shown) may be provided as components of an immovable comb structure, and structural element 181 (as well as additional comparable structural elements not shown) may be provided as component of a movable comb structure.

Figure 3:
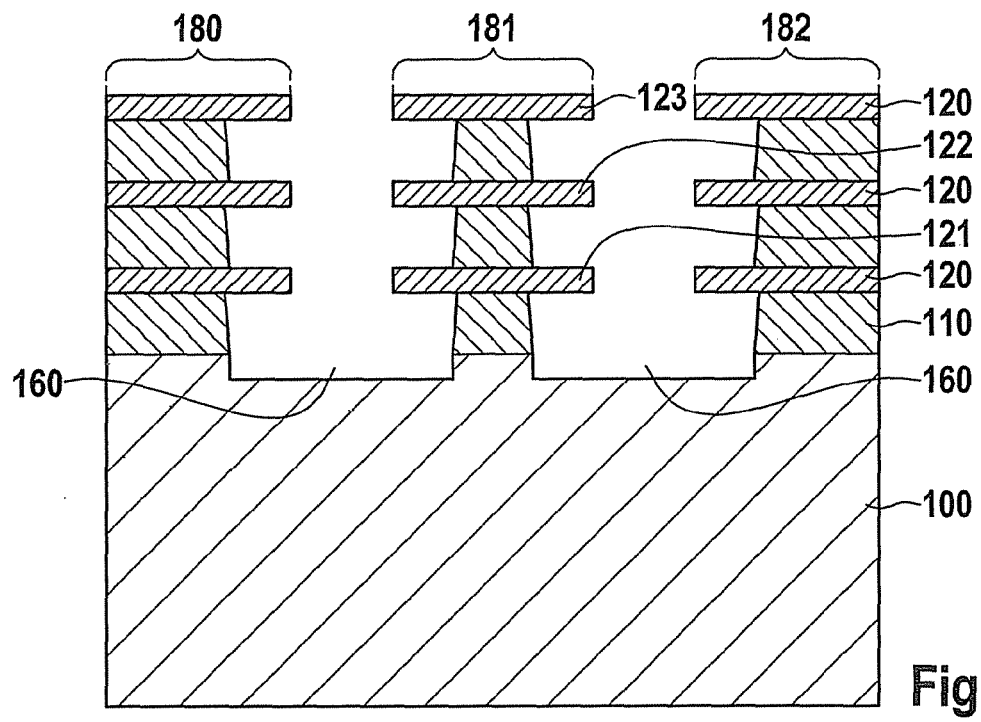
Figure 4:
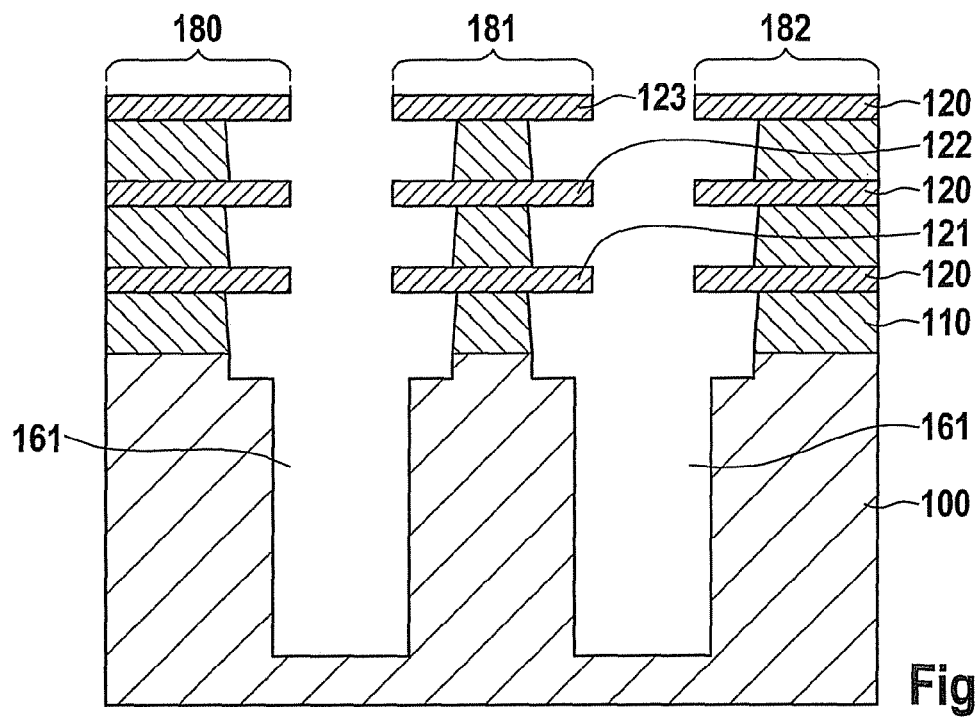

Subsequently to the carrying out of the isotropic etching process for the opening of oxide trenches 150, additional processes are carried out which are summarized in the flow chart of FIG. 6, in a further step 193. Under this category comes, for example, as shown in FIG. 3, the removal of protective layer structures 130 that are exposed after the oxide etching. Because of this, one is able to achieve, in a simple manner, that the metal circuit traces 120 of structural elements 180, 181, 182, that are arranged in different planes, are only still connected to one another via (previously bordered) sections of oxide material 110, and are insulated from one another as a result. To remove protective layer structures 130, which thus represent sacrificial structures may therefore be designated as "sacrificial plugs" or "sacrificial vias", an isotropic etching process or a dry etching process may be provided, for example. One possible example is a plasma etching process using $SF_6$ or $ClF_3$, for example. During the course of this etching process, a part of substrate 100 between structural elements 180, 181, 182 may be slightly etched, as is indicated in FIG. 3 in light of etching regions 160.

Moreover, within the scope of step 193, a patterning or (additional) removing of substrate material of substrate 100 takes place, in order to effect a (partial) exposing, and, with that, making possible movability of structural element 181 (as well as of further, not shown, structural elements of the movable comb structure) with respect to structural elements 180, 182 (as well as additional, not shown, structural elements of the immovable comb structure). For this purpose, after the removing of the protective layer structures 130, a front side trench etching process may be carried out to form trenches 161 between structural elements 180, 181, 182 (see FIG. 4) and a backside trench etching process (see FIG. 5). Trenches 161 may, in this case, be part of a common and connected trench structure. For the trench etching (also designated as "trenching"), in particular, an alternating dry etching process such as the so-called Bosch process comes into consideration, for example, in which passivating steps and etching steps are repeated cyclically. As a result of the trench etching, structural element 181 is situated (at least in the area of the sectional view shown in FIG. 5) on a partial section or a crosspiece made of substrate material of substrate 100.

Structural element 181, that includes the crosspiece, is suspended at another location on (remaining) substrate 100 in a movable and deflectable manner. This may be achieved, for example, in that within the scope of steps 191, 192, 193, a base structure or anchoring structure situated on substrate 100 is developed, on which structural element 181 (and additional structural elements of the movable comb structure) is/are fastened in a springy manner.

Figure 5:
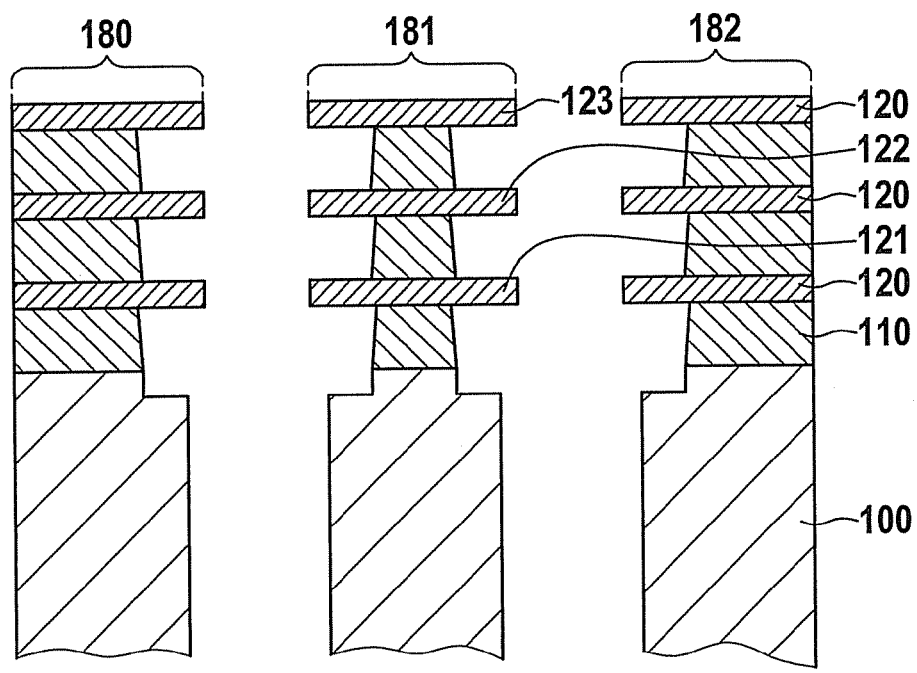

A structure brought about by the front side and backside trench etching, having a crosspiece including a substrate, is also possible for the other structural elements 180, 182, as is indicated in FIG. 5. However, structural elements 180, 182, in this case, are attached at a different place, in such a way to (remaining) substrate 100, that only structural element 181 is movable and the other structural elements 180, 182 are immovable. In this regard, within the scope of steps 191, 192, 193, an additional base structure or anchoring structure situated on substrate 100 may be developed, on which structural elements 180, 182 (and further structural elements of the immovable comb structure) are fastened immovably.

In the case of the micromechanical functional structure produced according to this method, a deflection (particularly lateral and horizontal or vertical) of the movable comb structure built up from structural element 181 and additional, not shown, structural elements, with respect to the immovable comb structure built up from structural elements 180, 182 and additional, not shown, structural elements, is able to be detected in a capacitive manner. In this case, metal circuit traces 120, situated in different planes, function as electrodes, with the aid of which a capacitance change, occurring in response to the deflection, is able to be detected. In this context, there exists the possibility of evaluating the capacitance or the capacitance change between metal circuit traces 120 of the same or even different planes.

The production method described above offers the possibility of developing the functional structure in such a way that movable and immovable structural elements 180, 181, 182 are narrow and have a relatively small width and a relatively high aspect ratio (ratio of height to width). Structural elements 180, 181, 182 may also be produced having small distances with respect to one another. These advantages are based particularly on the use protective layer structures 130 functioning as etch stop layers (together with metal circuit traces 120) and the carrying out of the isotropic oxide etching process. Since the oxide etching is connected with a slight or negligible removal of metal circuit traces 120 and protective layer structures 130, a relatively great thickness of the oxide material is able to be etched through. Because of the use of protective layer structures 130, the isotropic etching process is furthermore relatively uncritical with respect to etching parameters such as etching time and etching uniformity, whereby there comes about a clear simplification of the processing, in particular, of the oxide patterning. In this regard, one may circumvent the problem arising in conventional plasma etching processes, at high power and high etching rate, of electrical arc-overs having the result of the destruction of a component.

A further advantage is great reproducibility of the structure, since the latter is specified generally only by the tolerance of the CMOS production technology. The method is also compatible with other conventional processes for CMOS-MEMS production. The use of protecting protective layer structures 130 offers the additional possibility of fixing underetching rates and underetching widths of oxide material 110 in the different planes in a specified manner, depending on how far protective layer structures 130 are moved back from the outer edges of metal circuit traces 120. In this way it is possible to produce configurations having large and small underetching widths in all the oxide planes. In this regard, it is, for instance, also possible to set different etching widths in different planes, in contrast to the system shown in FIG. 2. Since structures of tungsten, or "tungsten plugs", are provided according to standard in CMOS process technology, the method is moreover able to be carried out relatively cost-effectively.

Furthermore, it is of advantage that in the removal of protective layer structures 130 by dry etching (see FIG. 3) relatively high etching rates are possible (for example, 200 to 800 nm/min). Based on the possible etching selectivity of a trench etching process, there is alternatively also the possibility of carrying out the removal of protective layer structures 130 (FIG. 3) and the development of trenches 161 (FIG. 4) in a common etching and trench etching process. In this manner, the method may be simplified further.

With the aid of the following figures, additional components having micromechanical functional structures and associated production methods are described, which represent additional possible modifications of the abovementioned specific embodiment(s). In this context, we point out that, with respect to the details already described, which relate to similar or identical components, production processes and materials that may be used, possible advantages, etc., reference is made to the above statements.

One further possible alternative is, for instance, to do without removing protective layer structures 130. In this respect, FIG. 7, as opposed to FIG. 5, shows a slightly modified functional structure, individual structural elements 180, 181, 182 being furthermore provided with protective layer structures 130, so that metal circuit traces 120 situated in different planes are conductively connected to one another. Such an embodiment may be considered for applications in which no insulation is required or provided between metal circuit traces 120 situated in the different planes, or in which the same electrical potential is applied in each case to all metal circuit traces 120 of a structural element 180, 181, 182. The production of the functional structure of FIG. 7 may be performed, for example, starting from the system of FIG. 2 in step 193 (FIG. 6), by carrying out an alternating dry etching process (cyclical sequence of passivating and etching steps) for trench etching, the procedure being started using a briefly executed etching step or a passivating step.

But even in applications in which no insulation between metal circuit traces 120 situated in the different planes is provided or required, the removal of protective layer structures 130 may take place nevertheless. The removal or the absence of the protective layer structures 130 including tungsten is of subsidiary importance, in this instance, for the capacitance of metal circuit traces 120 used as electrodes, since protective layer structures 130 are moved back compared to the outer edges of metal circuit traces 120, as described above, and as a result the capacitance is essentially specified by metal circuit traces 120.

One further possible alternative is the development of (movable) structural elements, in which no crosspieces of substrate material ("silicon support") are provided. With regard to such an embodiment, the advantages of the method, given above, may be utilized particularly in that the mechanical structures are able to be produced having high accuracy and reproducibility.

Figure 7:
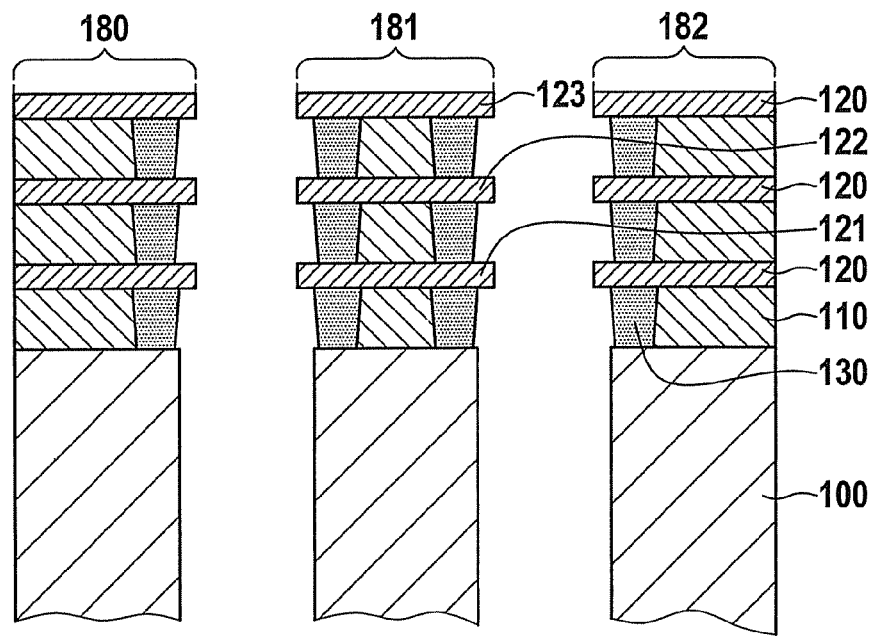
FIGS. 7 and 8 show schematic sectional representations of additional micromechanical functional structures.
Figure 8:
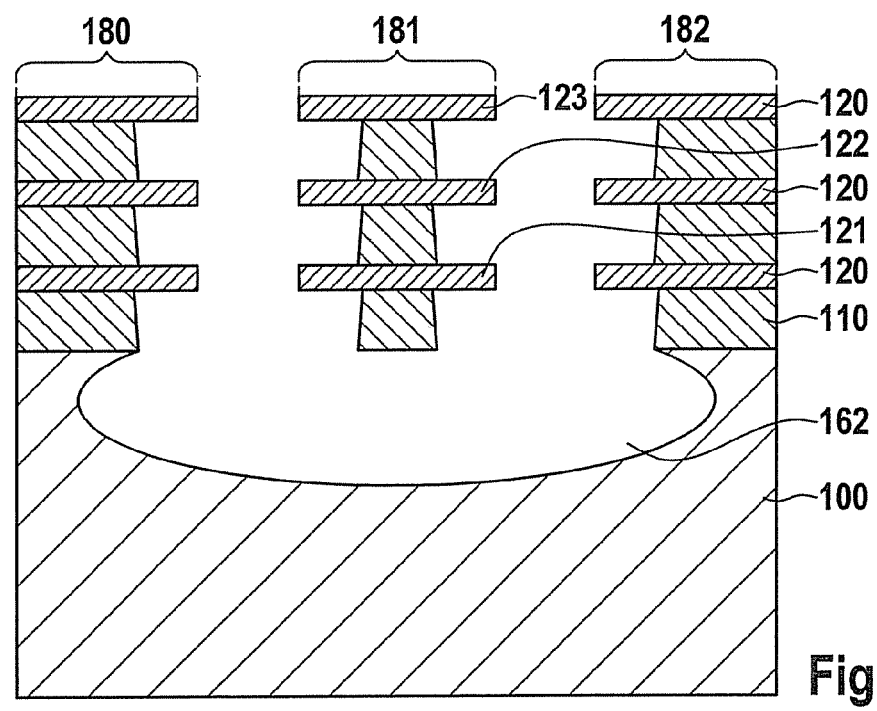

As an illustration, FIG. 8 shows an additional exemplary embodiment of a functional structure, in which exposing structural element 181 (as well as further structural elements, not shown, of the movable comb structure) takes place not by front side or backside trench etching processes, but by an isotropic etching process. During the course of the etching process, an etching region 162 is formed below structural element 181 in substrate 100. In such an isotropic etching process, $SF_6$ or $ClF_3$ may be used, for example, whereby at the same time the appropriate protective layer structures 130 are also able to be removed. Structural element 181 exposed in this manner (at least in the area of the sectional view shown in FIG. 7) has only one layer stack made of sections of oxide material 110 and metal circuit traces 120. At another place, structural element 181 is deflectable or suspended in a springy way on substrate 100, for instance, via a corresponding base structure or anchoring structure. Structural elements 180, 182 of the immovable comb structure, by contrast, in the area of the sectional view shown in FIG. 7, are also situated on substrate 100 and fixedly connected to it.

The removal of the exposed protective layer structures 130, depending on the etching process used, may result in the removal of substrate material between structural elements 180, 181, 182, as was described above, in connection with FIG. 3 (etching regions 160). In one normal process sequence, such substrate etching is uncritical. For producing especially narrow crosspieces, however, it is advantageous if substrate etching can be avoided. For this purpose, the method described below in light of FIGS. 9 through 14 may be carried out, which represents a further possible variant of the production method described above.

Figure 9:
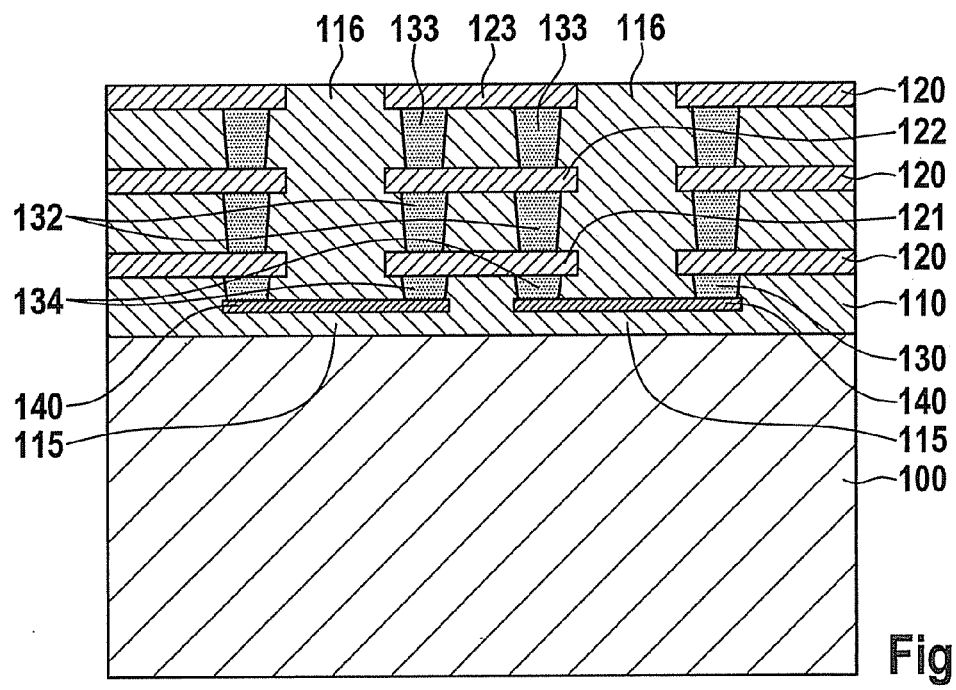
FIGS. 9 to 14 show the production of a further micromechanical functional structure, in each case in a schematic lateral sectional representation.

In this modified method, again in a step 191 (FIG. 6), a substrate 100 is provided having a layer system situated on substrate 100, which has the layout shown in FIG. 9. Comparably to the layer system of FIG. 1, the layer system of FIG. 9 (also) has metallic layer sections or metal circuit traces 120, situated in three different planes, and enclosing protective layer structures 130, which are (partially) embedded in an oxide material 110. These layers are again situated in the form of layer stacks, from which comb electrodes or structural elements 180, 181, 182 proceed (see FIG. 10).

In contrast to the layer system of FIG. 1, the lower protective layer structures 130 (designated in the middle layer stack by reference numeral 134) are, however, not connected to substrate 100, but to intervening layers 140, which are situated in the vicinity of the later oxide etching ("opening regions" or "opening areas"). In regard to the middle layer stack (of later structural element 181), associated protective layer structure 134 is connected to two intervening layers 140, as shown in FIG. 9, which are further connected to lower protective layer structures 130 of the layer stacks (of the later structural elements 180, 182), that are situated laterally to this. Intervening layers 140 have the effect of separating oxide material 110, namely, into a section 115, situated on substrate 100 or rather connected to it, on which intervening layers 140 are situated, and additional sections 116 that are present between the layer stacks, which are situated on intervening layers 140. The structure shown in FIG. 9, in this context, is able to repeat itself many times, as seen in the lateral direction.

An intervening layer 140 may, in particular, be a polysilicon layer that is usually present or developed in a CMOS process sequence. Layer section 115 of oxide material 110 lying below it may, in this instance, represent a gate oxide layer having a thickness of typically less than 10 nm, or a field oxide layer having a thickness of typically a few 100 nm.

The production of substrate 100 shown in FIG. 9 and provided with the layer system or "CMOS" wafer within the scope of step 191 may be carried out anew with the aid of CMOS processes. One possible process sequence includes developing section 115 of oxide material 110 on substrate 100, applying a (large-surface) layer 140 and patterning same to develop intervening layer 140, applying an (additional) layer of oxide material 110 and patterning same to develop recesses or trench structures for protective layer structures 130, filling up the recesses using appropriate protective layer material to develop protective layer structures 130, applying a metallic layer 120 and patterning same to develop metal circuit traces 120, as well as single (more or double) repetition of the processes following the development of intervening layers 140.

Figure 10:
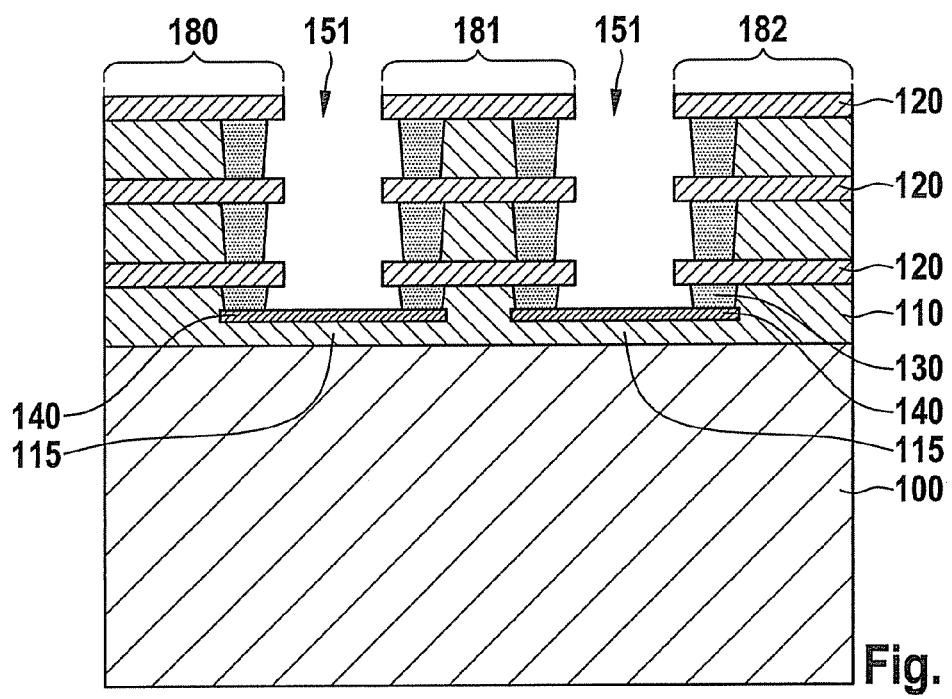

Following this, in an additional step. 192 (FIG. 6) an isotropic oxide etching process is again carried out, whereby the freely accessible proportion of oxide material 110, i.e. sections 116, are removed. As shown in FIG. 10, because of this, trenches 151 exposing a part of intervening layers 140 are developed, and because of trenches 151, structural element 180, 181, 182 are formed that are separated from one another. In the oxide etching, protective layer structures 130 together with metal circuit traces 120 are used as etch stop layers, whereby the removing of the sections of oxide material 110 respectively bordered by these structures is prevented. In a corresponding manner, intervening layers 140 also act as etch stop layers, and, together with lower protective layer structures 130, they prevent the removal of layer section 115 of oxide material 110.

Figure 11:
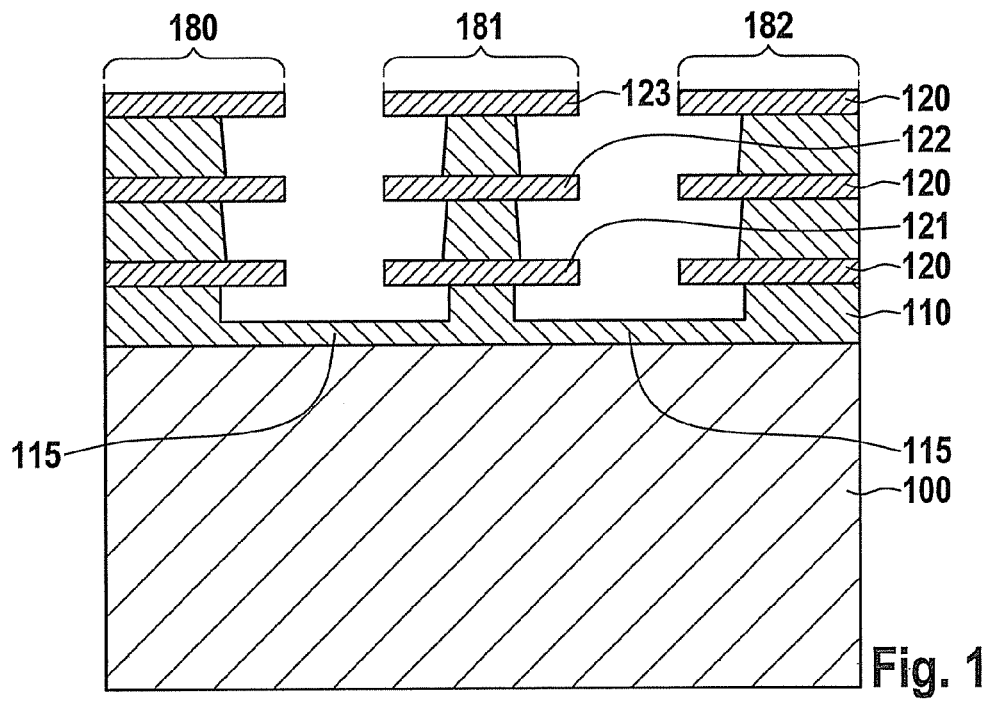

Subsequently to the carrying out of the isotropic etching process for the opening of oxide trenches 151, additional processes are again carried out which are summarized in the flow chart of FIG. 6, in a further step 193. Under this comes the removal of protective layer structures 130, by plasma etching, for example, using $SF_6$ or $ClF_3$, whereby at the same time the removal of intervening layers 140 may be effected, as shown in FIG. 11. This etching process is able to be stopped on layer section 115 of oxide material 110.

Figure 12:
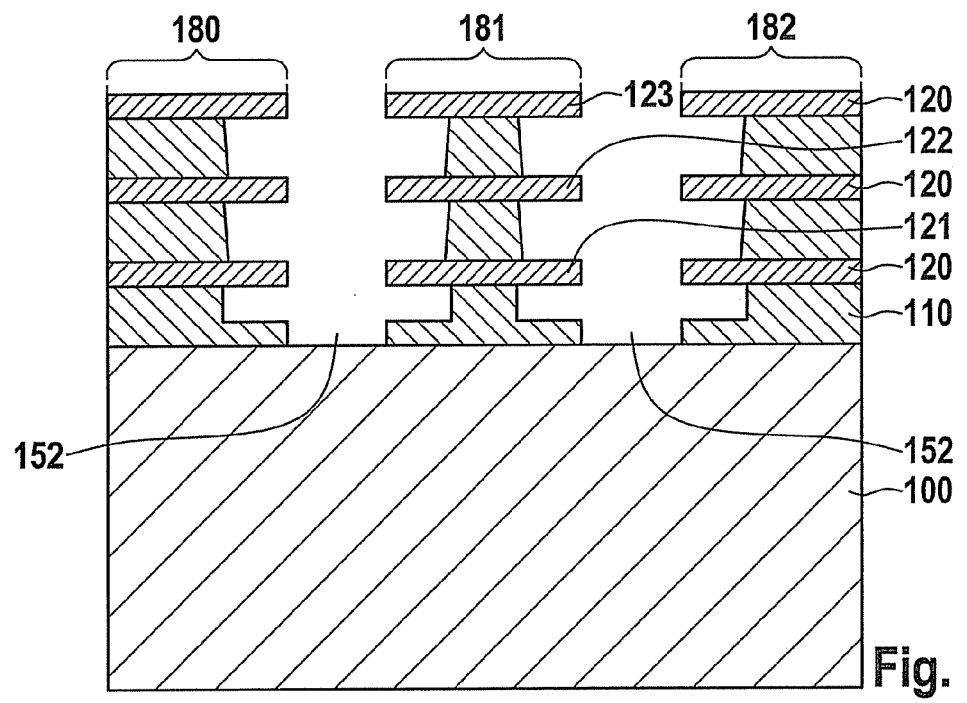
Figure 13:
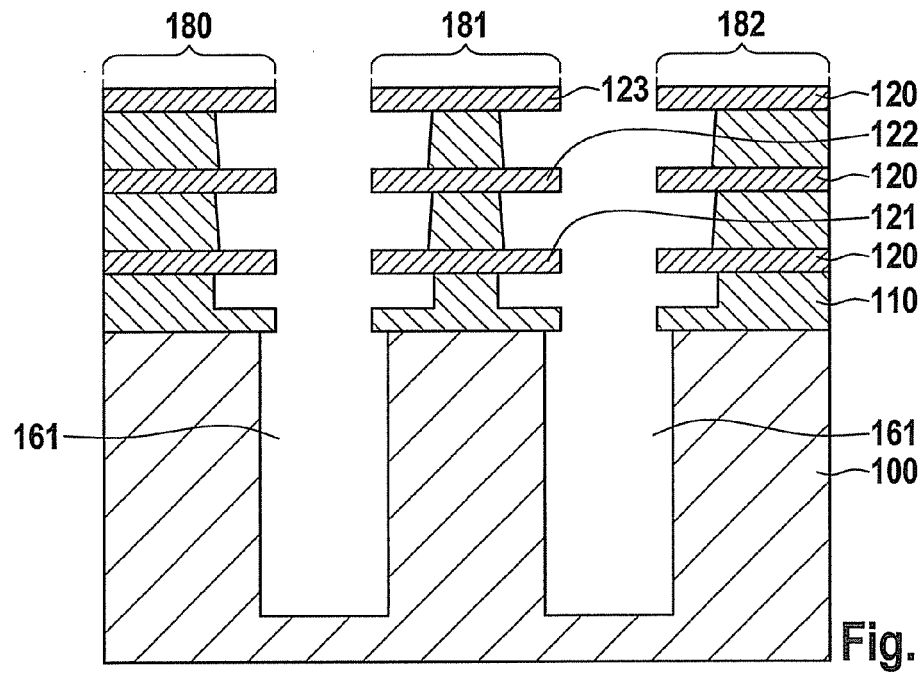
Figure 14:
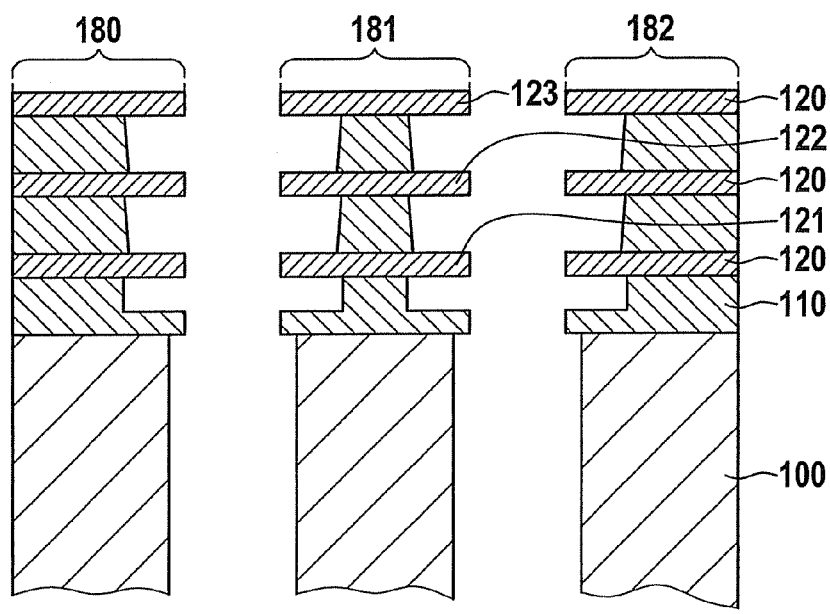

In another process carried out within the scope of step 193, as shown in FIG. 12, openings 152 are developed between structural elements 180, 181, 181 in layer section 115, through which the topside of substrate 100 is exposed at these places. This may be done, for example, using an anisotropic plasma etching process. Openings 152 may be designed, in this instance, to be relatively narrow, as indicated in FIG. 12. Subsequently, the follow-up processes described above, for exposing structural element 181 (and additional structural elements of the movable comb structure) are carried out, that is, a front side trench etching process to develop trenches 161 between structural elements 180, 181, 182 (see FIG. 13) and a backside trench etching process (see FIG. 14).

The processes described above may also be drawn upon for producing narrow differential electrode structures, in which (movable) electrode structures each have two metal circuit traces that are situated side by side in a plane. One example procedure will be described below, with reference to FIGS. 15 to 18.

Figure 15:
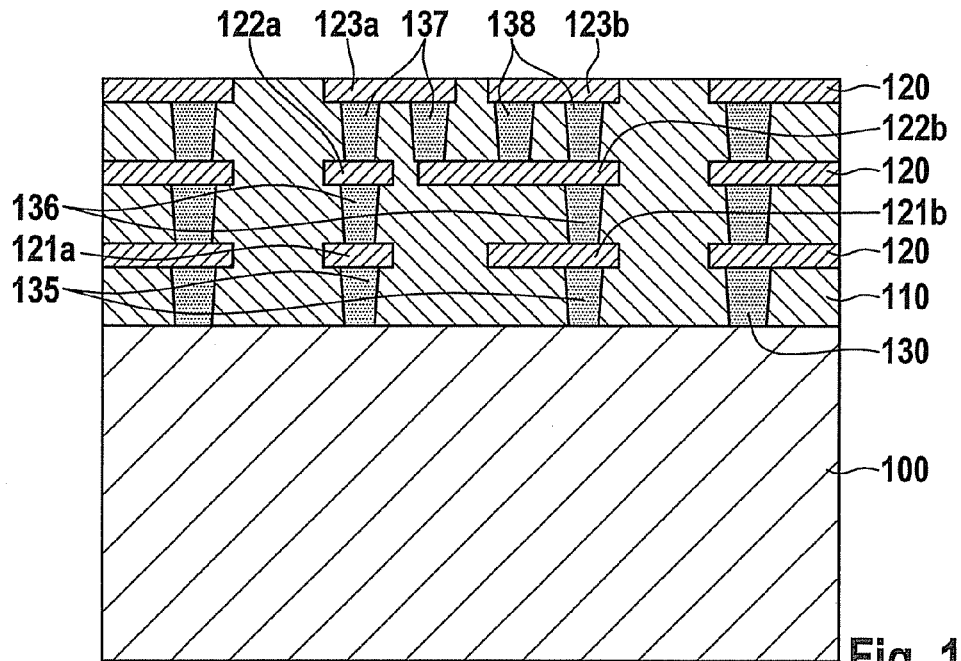
FIGS. 15 to 18 show the production of a further micromechanical functional structure, in each case in a schematic lateral sectional representation.

In this procedure, in a step 191 (FIG. 6) a substrate 100 is provided having a layer system situated on substrate 100, which has the design shown in FIG. 15. Comparable to the layer system of FIG. 1, the layer system of FIG. 9 (also) has metallic layer sections or metal circuit traces 120, situated in three different planes, and enclosing protective layer structures 130, which are (partially) embedded in an oxide material 110. These layers are again situated in the form of layer stacks, from which comb electrodes or structural elements 180, 183, 182 emerge (see FIG. 16). The arrangement shown in FIG. 15 which, as seen in the lateral direction, is able to repeat, may again be produced with the aid of CMOS processes that were described above.

By contrast to the layer system of FIG. 1, the middle layer stack of the layer system of FIG. 15, from which "differential" structural element 183 emerges, has a more complex design of metal circuit traces 120 and protective layer structures 130 which, for better illustration, are marked with reference numerals 121a, 121b, 122a, 122b, 123a, 123b, and 135, 136, 137, 138. The middle layer stack has, per "metal plane", in each case two metal circuit traces 121a and 121b, 122a and 122b, and 123a and 123b, that are situated side by side and separated from each other. Between metal circuit traces 121a, 121b and substrate 100, a single enclosing protective layer structure 135 is situated, and between metal circuit traces 121a, 121b and metal circuit traces 122a, 122b a single enclosing protective layer structure 136 is situated. In contrast to this, between metal circuit traces 122a, 122b and metal circuit traces 123a, 123b, two enclosing protective layer structures 137, 138 are provided. In this instance, protective layer structure 138 is connected only to metal circuit traces 122b, 123b that are situated on the right, and protective layer structure 137, that is situated on the left, is connected to the two metal circuit traces 122a, 122b and metal circuit trace 123a. The two layer stacks situated to the side of this, from which structural elements 180, 182 emerge, have the design described above, having only one metal circuit trace 120 and one enclosing protective layer structure 130 per plane.

Figure 16:
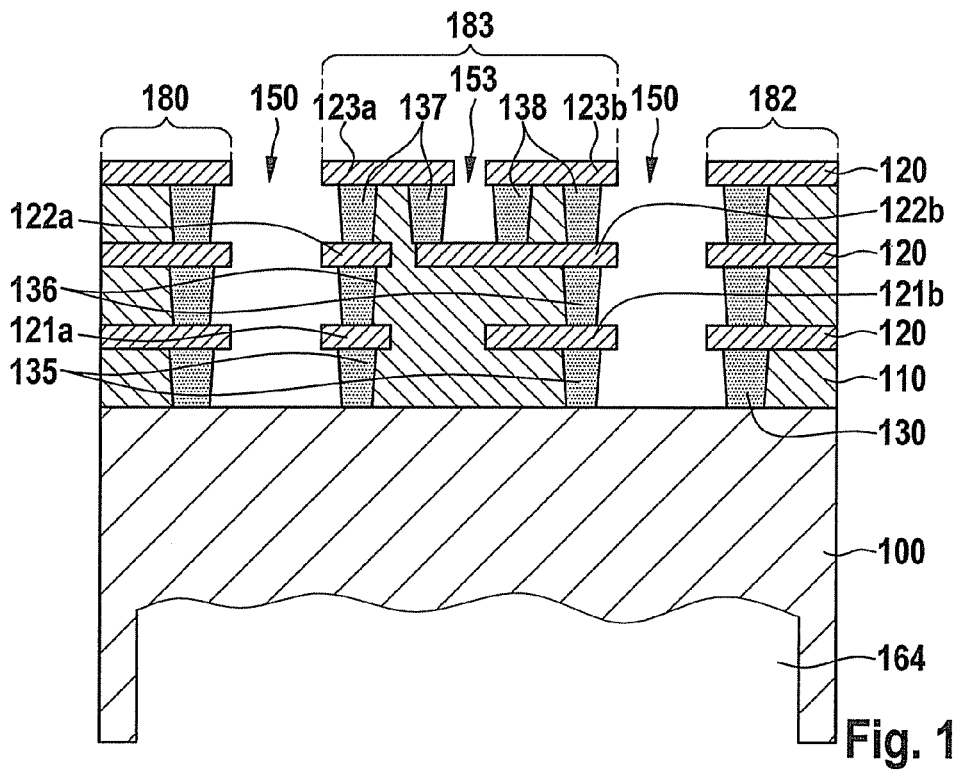

Subsequently to the providing of the "CMOS wafer" shown in FIG. 16, within the scope of an additional step 192 (FIG. 6), an isotropic etching process is carried out, in order to remove a freely accessible part of oxide material 110, protective layer structures 130 together with metal circuit traces 120 being used again as etch stop layers. In the oxide etching, as shown in FIG. 16, oxide trenches 150 exposing a part of the topside of substrate 100, and as a result, structural elements 180, 183, 182 are formed, that are separated from one another. In the case of the middle layer stack, that is, structural element 183, an oxide etching also takes place in addition, between upper protective layer structures 137, 138, as is indicated in FIG. 16 with the aid of an etching region 153.

FIG. 16 illustrates a further example modification of the production method. In this, it is provided that one should carry out a backside etching or trench etching process, in which a backside etching region 164 is developed in substrate 100, below structural element 183, already in an earlier method phase. Such an etching process may be provided before or even after the isotropic oxide etching.

Figure 6:
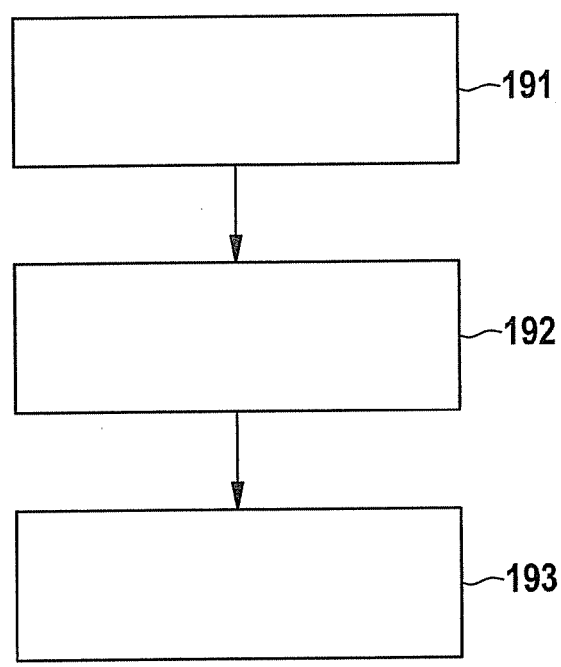
FIG. 6 shows a flow chart for illustrating steps of a method for producing a micromechanical component.
Figure 17:
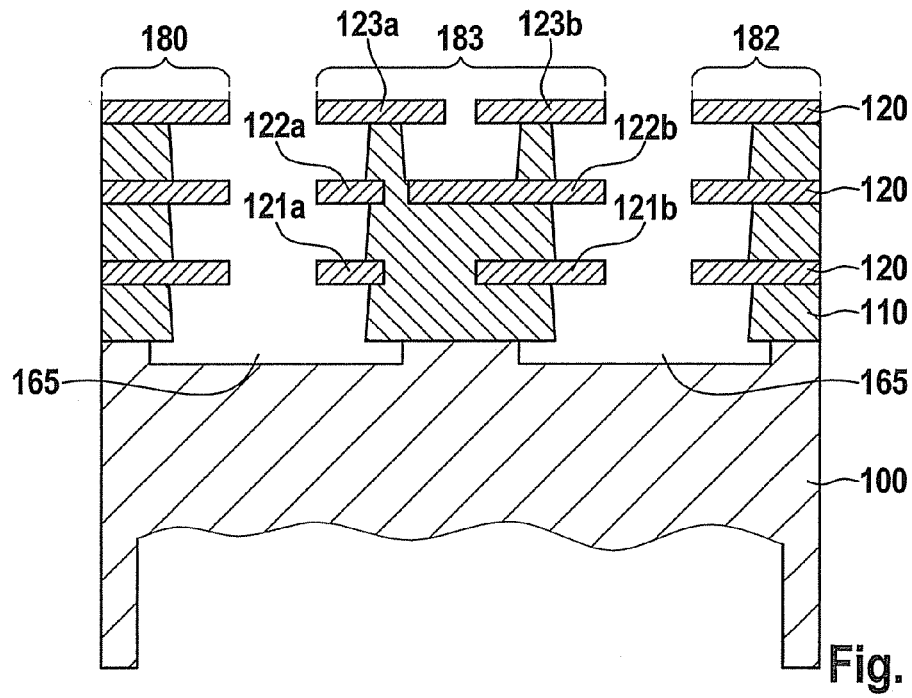

Subsequently to this, additional processes are carried out within the scope of step 193 (FIG. 6). Among these, as shown in FIG. 17, is removing protective layer structures 130 that are exposed after the oxide etching, whereby metal circuit traces 120 of structural elements 180, 183, 182, which are situated in the various planes, become insulated from one another. In differential structural element 183, in this way, metal circuit traces 121a and 121b, 122a and 122b, as well as 123a and 123b, that are situated respectively in the same plane, are able to be insulated from one another. It is thereby possible to apply different electrical potentials to the metal circuit traces or electrode sides that are insulated from one another. During the course of removing protective layer structures 130, a part of substrate 100, between structural elements 180, 183, 182 may also be slightly etched, as shown in FIG. 17 by etching regions 165.

Figure 18:
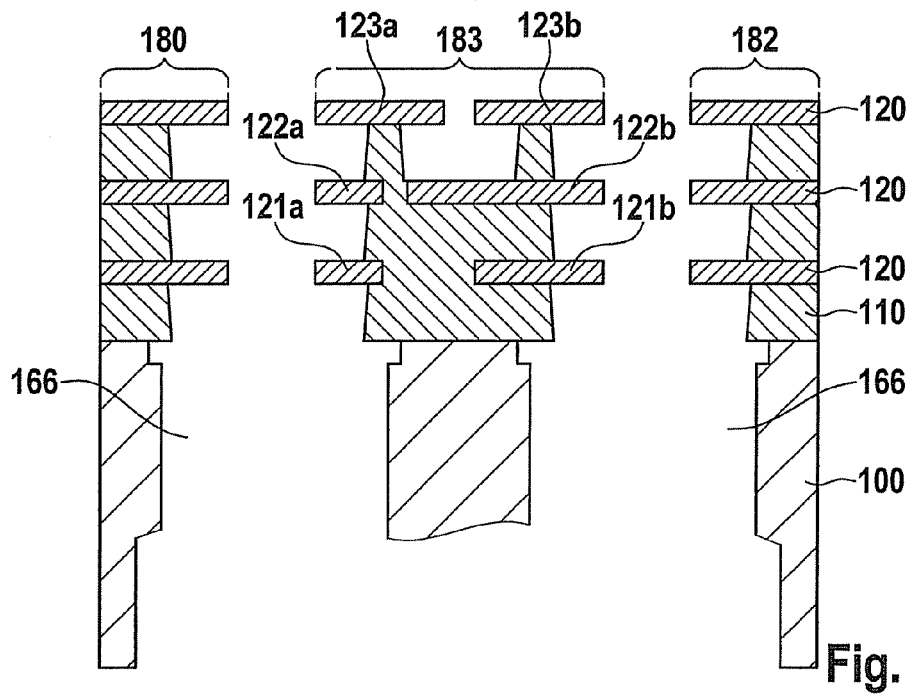

In addition, within the scope of step 193, there takes place an (additional) removing of substrate material of substrate 100, in order to bring about a (partial) exposure, and with that, make possible the movability of structural element 183 (as well as further structural elements of a movable comb structure, that are not shown) compared to structural elements 180, 182 (as well as additional structural elements, not shown, of an immovable comb structure). For this purpose, after removing protective layer structures 130, a front side trench etching process may be carried out to form trenches 166 between structural elements 180, 183, 182, as shown in FIG. 18. As a result of the trench etching, structural elements 183 (at least in the vicinity of the sectional view shown in FIG. 18) is situated on a partial section or crosspiece made of substrate material of substrate 100, and is therefore movable. At another place, structural element 183 is suspended in a deflectable manner on the (remaining) substrate 100. By contrast, the two other structures 180, 182 are situated on substrate 100, within the range of the sectional view shown in FIG. 18, and firmly connected to it.

The specific embodiments, explained with reference to the figures, represent preferred and exemplary specific embodiments of the present invention. In place of the specific embodiments, additional specific embodiments are possible, which may include further modifications, or even combinations of the features described.

For instance, the procedure described with reference to FIG. 17, to carry out a (backside) substrate or trench etching in an earlier method phase, may also be used in the other production methods described. In the same way, in the methods described with reference to FIGS. 15 to 18, a (front side and backside) trench etching (corresponding to the method shown in FIGS. 1 to 5) may take place only after the removal of protective layer structures 130. Alternatively, the method according to FIGS. 15 to 18 may also be modified in such a way that an isotropic etching process is provided to remove substrate material corresponding to FIG. 8, or that the use of intervening layers 140 is provided, corresponding to FIGS. 9 to 14.

Beyond that, the possibility exists of carrying out additional processes to the ones described and/or developing additional elements and structures. Under the category of additional processes, there is, for instance, a sectioning process separating a component, that is produced in common with other components on a substrate or wafer 100, from other components, and to separate it.

A provided CMOS wafer may also be equipped additionally with appropriate circuit structures or CMOS circuit structures which, in particular, form an evaluation circuit for the micromechanical functional structures of the associated component or sensor. By doing this, MEMS patterns and an associated evaluation circuit in the form of a CMOS circuit may be realized on a, or within a single chip ("monolithically integrated micromechanical sensor"). In this regard, it may further be provided that one should cover CMOS circuit regions and other regions, which are not required as functional structures, by a protective layer, before an isotropic oxide etching. Such a protective layer may be removed at the end of the process or, if necessary, be renewed during the production method. In such a method, it is of advantage that all the steps for producing functional structures are able to take place only after the actual CMOS production process.

One further possible modification is to carry out a partial exposing of a structural element, to enable the movability (also) within the scope of an isotropic oxide etching. It is possible, for example, to develop a layer stack for a structural element, having a plurality of metal circuit traces 120, situated in different planes, and one or more protective layer structures 130, no protective layer structure 130 being provided in a lower plane (bordering on substrate 100). In this way, the lowest metal circuit trace 120 of such a layer stack may be underetched during oxide etching, and thus the associated structural element (which, during the oxide etching is additionally patterned and separated from adjacent structural elements) may at this point be detached from the substrate.

Moreover, we point out that, in place of the materials described, other materials may be used. For instance, instead of tungsten, it is possible to use another material for protective layer structures 130, such as copper. Metal circuit traces 120 may also be made of another electrically conductive material than aluminum, such as also copper. Furthermore, a substrate 100 may have a different material than silicon, or rather be made of a different material. One possible example for an alternative substrate material is silicon carbide. Furthermore, instead of the oxide material 110 described, another insulating or dielectric material, for instance, a nitride material, may be considered. In place of an oxide material 110, combinations of different materials or combinations of layers (applied one after the other) made of different materials are possible, for example, combinations of an oxide material and a nitride material.

Furthermore, it is possible to provide structural elements having a different design, particularly having different numbers of metal circuit traces 120, situated one on top of another, and protective layer structures 130. In this regard, only one metal circuit trace 120 and only one associated protective layer structure 130 may be considered.

Moreover, the method and its possible modifications are not only limited to the production of capacitive inertial sensors having comb electrodes, but may also be drawn upon for producing other micromechanical components and sensors, and/or for producing other micromechanical or cantilevered functional structures as finger-like comb electrodes. Capacitive yaw rate sensors and magnetic field sensors are possible examples for other components.

What is claimed is:

1. A method for producing a micromechanical component, comprising:
   providing a substrate having a layer system including an insulating material situated on the substrate, a conductive layer section, and a protective layer structure connected to the conductive layer section which borders a section of the insulating material;
   carrying out an isotropic etching process to remove a part of the insulating material, the conductive layer section and the protective layer structure preventing removal of a bordered section of the insulating material, and a structural element being developed, which includes the conductive layer section, the protective layer structures and the bordered section of the insulating material; and
   carrying out an etching process for removing one of the protective layer structure or the protective layer structures, after carrying out the isotropic etching process for removing a part of the insulating material.

2. The method as recited in claim 1, wherein:
   the layer system situated on the provided substrate includes a plurality of conductive layer sections situated in different planes and connected by protective layer structures, the protective layer structures in each case border a section of the insulating material; and
   the carrying out of the isotropic etching process for removing a part of the insulating material forms a structural element which includes conductive layer sections, protective layer structures and bordered sections of the insulating material, situated in a plurality of planes.

3. The method as recited in claim 1, wherein a structural element is developed which, in different planes, has in each case two conductive layer sections.

4. The method as recited in claim 1, wherein, in the layer system situated on the provided substrate, a protective layer structure connected to a conductive layer section is connected to the substrate.

5. The method as recited in claim 1, wherein the layer system situated on the provided substrate has an intervening layer which is connected to a conductive layer section via a protective layer structure, and by which a section of the insulating material, connected to the substrate, is separated from an additional section of the insulating material, so that, in response to the carrying out of the isotropic etching process for removing a part of the insulating material, the additional section of the insulating material is removed, and the section of the insulating material that is connected to the substrate is protected from being removed.

6. The method as recited in claim 1, wherein the insulating material is an oxide material.

7. The method as recited in claim 1, wherein the one protective layer structure includes at least one of tungsten and copper.

8. A method for producing a micromechanical component, comprising:
   providing a substrate having a layer system including an insulating material situated on the substrate, a conductive layer section, and a protective layer structure connected to the conductive layer section which borders a section of the insulating material;

carrying out an isotropic etching process to remove a part of the insulating material, the conductive layer section and the protective layer structure preventing removal of a bordered section of the insulating material, and a structural element being developed, which includes the conductive layer section, the protective layer structures and the bordered section of the insulating material;

wherein the layer system situated on the provided substrate includes a plurality of conductive layer sections situated in different planes and connected by protective layer structures, the protective layer structures in each case border a section of the insulating material;

wherein the carrying out of the isotropic etching process for removing a part of the insulating material forms a structural element which includes conductive layer sections, protective layer structures and bordered sections of the insulating material, situated in a plurality of planes; and removing substrate material of the substrate to expose the structural element.

9. A method for producing a micromechanical component, comprising:

providing a substrate having a layer system including an insulating material situated on the substrate, a conductive layer section, and a protective layer structure connected to the conductive layer section which borders a section of the insulating material;

carrying out an isotropic etching process to remove a part of the insulating material, the conductive layer section and the protective layer structure preventing removal of a bordered section of the insulating material, and a structural element being developed, which includes the conductive layer section, the protective layer structures and the bordered section of the insulating material;

wherein the layer system situated on the provided substrate has an intervening layer which is connected to a conductive layer section via a protective layer structure, and by which a section of the insulating material, connected to the substrate, is separated from an additional section of the insulating material, so that, in response to the carrying out of the isotropic etching process for removing a part of the insulating material, the additional section of the insulating material is removed, and the section of the insulating material that is connected to the substrate is protected from being removed; and wherein the intervening layer is removed within the scope of removing one of the protective layer structure or the protective layer structures, and wherein an additional etching process is carried out to remove a part of the section of the insulating material that is connected to the substrate.

* * * * *